United States Patent
Chang et al.

(10) Patent No.: US 7,274,072 B2
(45) Date of Patent: Sep. 25, 2007

(54) HYBRID BULK-SOI 6T-SRAM CELL FOR IMPROVED CELL STABILITY AND PERFORMANCE

(75) Inventors: Leland Chang, New York, NY (US); Shreesh Narasimha, Beacon, NY (US); Norman J. Rohrer, Underhill, VT (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 187 days.

(21) Appl. No.: 11/108,012

(22) Filed: Apr. 15, 2005

(65) Prior Publication Data
US 2006/0231899 A1 Oct. 19, 2006

(51) Int. Cl.
*H01L 29/72* (2006.01)
(52) U.S. Cl. .................. 257/368; 257/67; 257/347; 257/354; 365/154; 365/156
(58) Field of Classification Search .............. 257/368, 257/67, 347, 354; 365/154, 156
See application file for complete search history.

(56) References Cited

OTHER PUBLICATIONS

M. Yang, et al., IEDM 2003.*

J. Tschanz, et al., IEEE Journal of Solid State Circuits, vol. 37, No. 11, pp. 1396-1402, Nov. 2002.*
M. Yang, et al., "High-Performance CMOS SOI Devices on Hybrid Crystal Oriented Substrates". IEDM 2003.
J. Tschanz, et al. "Adaptive Body Bias For Reducing Impacts of Die-to-Die and Within-Die Parameter Variations on Microprocessor Frequency and Leakage" IEEE Journal of Solid-State Circuits, vol. 37, No. 11, pp. 1396-1402, Nov. 2002.

* cited by examiner

*Primary Examiner*—Edward Wojciechowicz
(74) *Attorney, Agent, or Firm*—Scully, Scott, Murphy & Presser, P.C.; Ido Tuchman, Esq.

(57) ABSTRACT

The present invention provides a 6T-SRAM semiconducting structure including a substrate having an SOI region and a bulk-Si region, wherein the SOI region and the bulk-Si region have a same or differing crystallographic orientation; an isolation region separating the SOI region from the bulk-Si region; and at least one first device located in the SOI region and at least one second device located in the bulk-Si region. The SOI region has an silicon layer atop an insulating layer. The bulk-Si region further comprises a well region underlying the second device and a contact to the well region, wherein the contact stabilizes floating body effects. The well contact is also used to control the threshold voltages of the FETs in the bulk-Si region to optimized the power and performance of the SRAM cell built from the combination of the SOI and bulk-Si region FETs.

30 Claims, 7 Drawing Sheets

HYBRID BULK-SOI 6T-SRAM CELL FOR IMPROVED CELL STABILITY AND PERFORMANCE

FIELD OF THE INVENTION

The present invention relates to semiconductor devices, and more particularly to integrated semiconductor devices, such as complementary metal oxide semiconductor (CMOS) devices formed atop a substrate having thin silicon-on-insulator (SOI) and bulk-Si portions, wherein the SOI and bulk-Si portions of the substrate have either the same or differing crystalline orientation. In particular, the present invention forms nFET and pFET devices on SOI and bulk-Si regions of a semiconducting substrate having either a surface on a (100), (110), or (111) crystal plane. The bulk-Si region of the substrate may also be processed to provide devices substantially free of floating body effects that are typically present in the devices formed with SOI substrates. More specifically, the present invention relates to a 6T-SRAM (six transistor static random access memory) cell that has improved stability and performance.

BACKGROUND OF THE INVENTION

Silicon-on-insulator (SOI) devices offer several advantages over more conventional semiconductor devices. For example, SOI devices may have lower power consumption requirements than other types of devices that perform similar tasks. SOI devices may also have lower parasitic capacitances than non-SOI devices. This translates into faster switching times for the resulting circuits. In addition, the phenomenon of "latchup," which is often exhibited by complementary metal-oxide semiconductor (CMOS) devices, may be avoided when circuit devices are manufactured using SOI fabrication processes. SOI devices are also less susceptible to the adverse effects of ionizing radiation and, therefore, tend to be more reliable in applications where ionizing radiation may cause operation errors.

A drawback in some SOI circuits is the floating body effect. Due to the additional isolation of the SOI device, the body or well node is not typically contacted. In principal, body tie structures may be employed in SOI CMOS to add a contact to the floating body node, but this introduces parasitic resistances and capacitances which would negate the favorable impact of adaptive well biasing.

For many digital circuits, this impact can be neglected. However, certain circuit array cell stability, such as the commonly used 6T SRAM cell, is degraded due to tolerance issues arising from the floating body. This is typically handled with increasing the linear threshold voltage (Vt) of the FETs in the array, but this is usually at the cost of lowering the overall array performance.

A recent innovation, hybrid orientation CMOS technology (HOT) uses both SOI nFETs and pFETs and conventional bulk nFETs and pFETs (see, for example, M. Yang, et al., IEDM 2003, p. 453 and U.S. application Ser. No. 10/250,241, filed Jun. 17, 2003, entitled "High-Performance CMOS SOI Devices on Hybrid Crystal Oriented Substrates").

Additionally, the same or different crystallographic orientations can be used for nFET and pFET devices. The use of different crystallographic orientations allows for independently optimizing the performance of an nFET (which in silicon has highest mobility and performance in the (100) orientation) and the pFET (which in silicon has the highest mobility and performance in the (110) orientation). Additionally, it is known within the art, that nFET devices formed atop a (110) crystal plane have decreased carrier mobility and switching speed. With the availability of hybrid bulk-SOI CMOS or hybrid orientation (HOT) bulk-SOI CMOS, the opportunity exists to place some of the array devices in bulk CMOS. In all cases, the elimination of the floating body effect in a portion of the cell will reduce the need for linear Vt increases and will provide for better cell stability and performance. Additionally, the contact to the well region for some of the devices permits the use of adaptive well biasing (see, for example, J. Tschanz, et al., J. Solid State Circuits, 2002, p.1396.), through which the Vt's of FETs in this region may be controlled by adjusting the well node bias value. Adjusting the Vt's dynamically could be used in arrays to reduce power in a processor sleep mode (by raising the Vt's in this mode) or to increase performance when the array is being accessed (by lowering the Vt's in this mode).

In view of the above, there is a need for providing a hybrid bulk SOI 6T SRAM cell that exhibits improved cell stability and performance wherein adaptive well biasing is employed.

SUMMARY OF THE INVENTION

The present invention provides a 6T SRAM cell that includes field effect transistors (FETs) on a SOI substrate region having a device channel capable of being either partially or fully depleted of charge carriers in combination with FETs within a bulk-Si region having a highly doped well body contact which substantially eliminates floating body effects and provides a means to use adaptive well biasing thereby providing a means to control the threshold voltages of the bulk-Si region FETs with an applied bias on the well terminal.

The present invention combines the use of the HOT structure with devices in the 6T-SRAM array. A highly doped well is created and contracted for the device type located in the bulk-Si region. The floating body effect is then eliminated for the FETs placed in the bulk-Si region and the array performance and stability is improved, as the need to raise the linear Vt value, as in a conventional SOI 6T-SRAM cell, is eliminated. Additionally, the well or body node provides the means for applying a bias to implement the adaptive well biasing technique for the devices placed in the conventional bulk CMOS region. Additionally, because the well is unipolar, there are no well to well leakage or capacitance penalties for implementing the adaptive well biasing, which is a major advantage over the conventional bulk CMOS scheme for adaptive well biasing. Adaptive well biasing can be used to either reduce the power consumption of the array or increase the array performance dynamically as needed by the circuit application.

Broadly, the present invention provides a 6T SRAM cell structure that comprises:

a substrate comprising an SOI region and a bulk-Si region, wherein said SOI region and said bulk-Si region have a same or differing crystallographic orientation;

an isolation region separating said SOI region from said bulk-Si region;

a well region underlying a device in said bulk-Si region and a contact to said well region, wherein said contact stabilizes the threshold voltages in FETs in the bulk-Si region through application of a bias voltage; and a device configuration selected from the group consisting of (a) two pass-gate nFET devices located in the bulk-Si region and two pull-down nFET devices and two pull-up pFET devices located in the SOI region, (b) two pass-gate nFET devices and two-pull down nFET devices located in the bulk-Si region and two pull-up pFET devices located in the SOI region, (c) two pull-down nFET devices located in the bulk-Si region and two pass-gate nFET devices and two pull-up pFET devices located in the SOI region and (d) two pull-up pFET devices located in the bulk-Si region and a pull-down nFET and a pass-gate nFET located in the SOI region.

In accordance with the present invention, the SOI region of the substrate comprises an SOI layer having a thickness that is capable of being either fully or partially depleted of charge carriers when the device is forward biased. The bulk-Si region may further include at least one resistor, capacitor, diode or a combination thereof.

The above structure can be provided by utilizing a method that includes wafer bonding, masking, etching and regrowth of a semiconductor layer. Specifically, the method of the present invention comprises the steps of providing a substrate comprising at least a first semiconductor layer and a second semiconductor layer separated by an insulating layer, said first semiconductor layer and said second semiconductor layer having a same or differing crystalline orientation; protecting a portion of the substrate to define an SOI region, while leaving another portion of the substrate unprotected, said unprotected portion of the substrate defining a bulk-Si region; etching said unprotected portion of the substrate to expose a surface of the second semiconductor layer; regrowing a semiconductor material on said exposed surface of the second semiconductor layer, said semiconductor material having said same crystalline orientation; planarizing the substrate containing the semiconductor material so that an upper surface of the first semiconductor layer is substantially planar with an upper surface of the semiconductor material; and forming at least one first device in said SOI region, while forming at least one second device on said semiconductor material in said bulk-Si region. In particular, one device configuration selected from groups (a)-(d) mentioned above are processed.

In accordance with the present invention, the second device within the bulk-Si region can be formed by implanting the bulk-Si region with a first type dopant to provide a well region, forming at least one gate region atop a surface of the bulk-Si region, forming source and drain regions adjacent at least one gate region with a second type dopant, and forming a contact to the well region, wherein the contact stabilizes floating body effects and provides a well contact which may be utilized for adjusting the threshold voltages of the devices in the bulk Si region. Forming the contact to the well region comprises etching a portion of the surface of the bulk-Si region to provide a via to the well region; and filling the via to the well region with a conductive material.

In accordance with the present invention, selected devices in a six transistor static random access memory (6T-SRAM) are placed in the bulk-Si region while leaving the other transistors in the SOI region. Specifically, four cases are considered (See (a)-(d) above). In the first case, only the two nFET pass-gate devices, or access devices, are placed in the bulk-Si region. In the second case, both the two-pass nFET gate devices and the two pull-down nFET devices are in the bulk-Si region. In the third case, only the two pull-down nFET devices are in the bulk-Si region. In these three cases, the bulk region crystallographic orientation would mostly likely be (100) for optimal nFET device performance. In the fourth and final case, both pull-up pFET devices would be in the bulk-Si region. In the forth case, the bulk region crystallographic orientation would mostly likely be (110) or (111) for optimal nFET device performance in a silicon device. More generally, in other semiconductor material systems (such as other group IV elements, and group III-V and II-VI compounds), the HOT process enables the optimal crystallographic orientation to be used for nFET and pFET devices. The same issues for floating body SOI versus bulk devices would apply for these cases as well.

DETAILED DESCRIPTION OF THE INVENTION

Figure 1A:
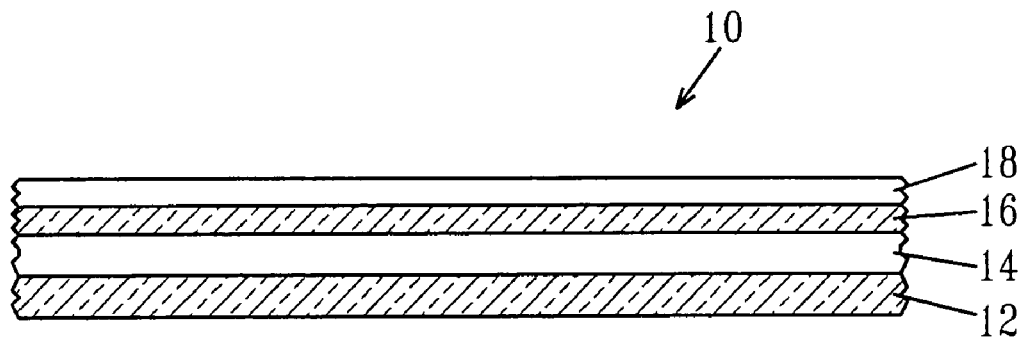
FIGS. 1A-1F are pictorial representations (through cross sectional views) illustrating the basic processing steps used in forming a CMOS device containing high performance SOI channel MOSFET semiconductor devices having body contacts.

The present invention, which provides a method for increasing the SRAM cell stability and performance in a hybrid bulk-SOI technology over that of a conventional SOI technology, will now be described in greater detail by referring to the following discussion as well as the drawings that accompany the present application. In the accompanying drawings, like and correspondence elements are referred to by like reference numerals. It is noted that the drawings of the present invention are provided for illustrative purposes and thus they are not drawn to scale.

FIG. 1A illustrates a substrate 10, i.e., hybrid substrate, which may be employed in the present invention. As shown, the substrate 10 includes a surface dielectric layer 18, a first semiconductor layer 16, an insulating layer 14, and a second semiconductor layer 12.

The surface dielectric layer 18 of the substrate 10 is an oxide, nitride, oxynitride or other insulating layer that is either present in one of the initial wafers before bonding, or formed atop the first semiconductor layer 16 after wafer bonding by either a thermal process (i.e., oxidation, nitridation or oxynitridation) or by deposition. Notwithstanding the origin of the surface dielectric layer 18, the surface dielectric layer 18 has a thickness from about 3 nm to about 500 nm, with a thickness from about 5 nm to about 20 nm being more typical.

The first semiconductor layer 16 is comprised of any semiconducting material including, for example, Si, SiC, SiGe, SiGeC, Ge alloys, GaAs, InAs, InP as well as other III-V or II-VI compound semiconductors. First semiconductor layer 16 may also comprise an SOI layer of a preformed SOI substrate or a layered semiconductor such as, for example, Si/SiGe. In one highly preferred embodiment, the first semiconductor layer 16 comprises a Si-containing semiconductor material. The first-semiconductor layer 16 has the same or differing crystalline orientation as the second semiconductor layer 12, preferably being in the (100) crystal plane. Although a (100) crystal orientation is preferred, the first semiconductor layer 16 may have a (111) crystal plane, (110) crystal plane or other crystal plane, so long as the first semiconducting layer 16 is not a Si-containing material that is subsequently processed to provide an nFET device on a (110) crystal plane.

The thickness of the first semiconductor layer 16 may vary depending on the initial starting wafers used to form the substrate 10. Typically, however, the first semiconductor layer 16 has an initial thickness from about 5 to about 100 nm, which can be thinned to a thickness of 40 nm or less. Specifically, the first semiconductor layer 16 is thinned to a desired thickness by planarization, grinding, wet etch, dry etch or any combination thereof. In a preferred embodiment, the first semiconductor layer 16 is thinned by oxidation and wet etching to achieve the desired thickness to provide the upper Si-containing layer of an thin silicon-on-insulator substrate for the purpose of this disclosure.

The insulating layer 14 which is located between the first semiconductor layer 16 and the second semiconductor layer 12 has a variable thickness depending upon the initial wafers used to create the substrate 10. Typically, however, the insulating layer 14 has a thickness from about 1 nm to about 500 nm, with a thickness from about 1 nm to about 50 nm being more typical. The insulating layer 14 is an oxide or other like insulator material that is formed on one or both of the wafers prior to bonding.

The second semiconductor layer 12 is comprised of any semiconducting material which may be the same or different from that of the first semiconductor layer 16. Thus, second semiconductor layer 12 may include, for example, Si, SiC, SiGe, SiGeC, Ge alloys, GaAs, InAs, InP as well as other III-V or II-VI compound semiconductors. Second semiconductor layer 12 may also comprise an SOI layer of a preformed SOI substrate or a layered semiconductor such as, for example, Si/SiGe. In one highly preferred embodiment of the present invention, the second semiconductor layer 12 is comprised of a Si-containing semiconductor material. The second semiconductor layer 12 has the same or differing crystalline orientation as the first semiconductor layer 16, preferably being in the (100) crystal plane. Although a (100) crystal orientation is preferred, the second semiconductor layer 12 may have a (111) crystal plane, (110) crystal plane or other crystal plane, so long as the second semiconducting layer 12 is not a Si-containing material that is subsequently processed to provide an nFET device on a (110) crystal plane.

The thickness of the second semiconductor layer 12 may vary depending on the initial starting wafers used to form the substrate 10. Typically, however, the second semiconductor layer 12 has a thickness from about 5 nm to about 200 nm, with a thickness from about 5 to about 100 nm being more typical.

Figure 2A:
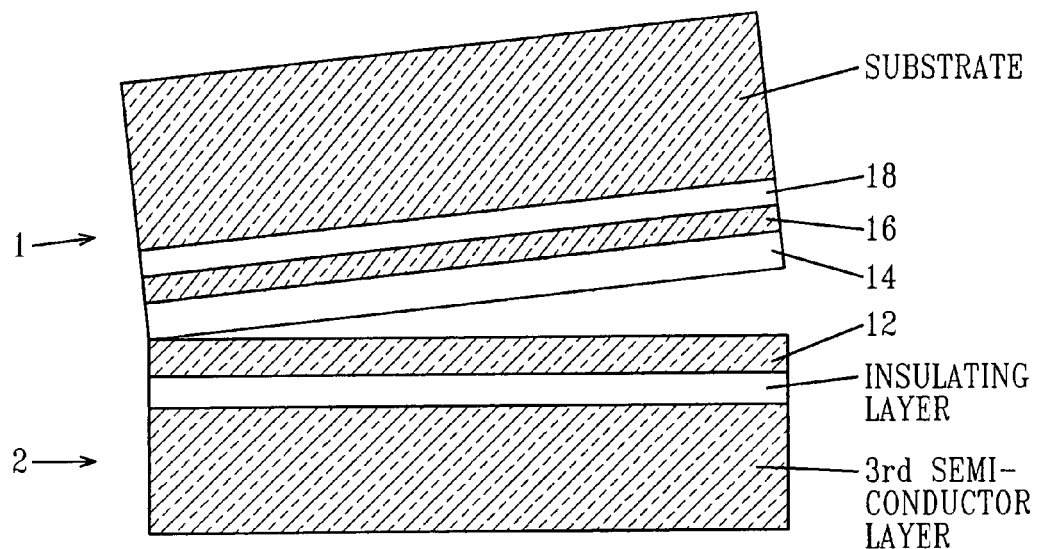
FIGS. 2A-2C are pictorial representations of various wafers that may be bonded together and are used in the method described in FIGS. 1A-1F.
Figure 2B:
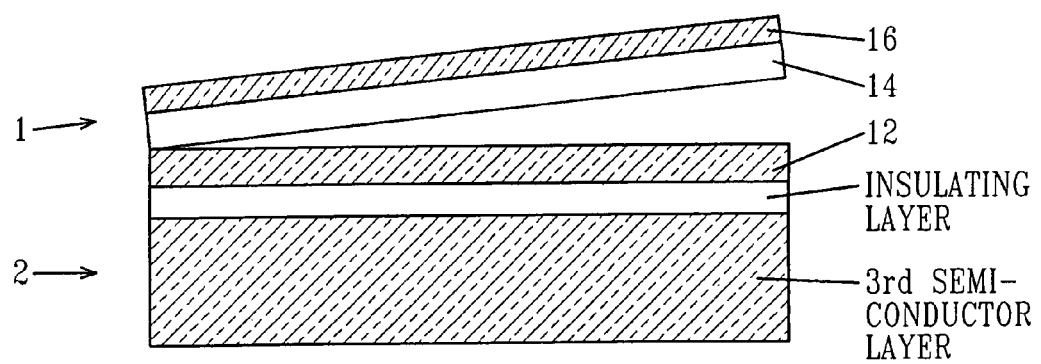
Figure 2C:
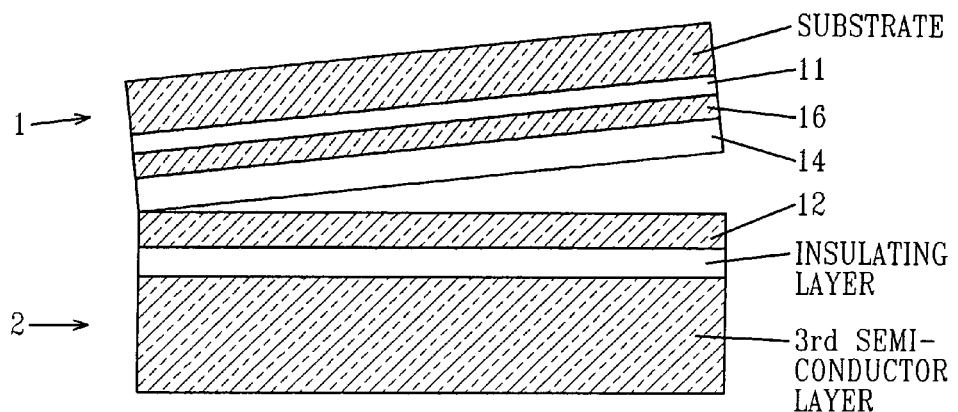

The substrate 10 illustrated in FIG. 1A is comprised of two semiconductor wafers that are bonded together. The two wafers used in fabricating the substrate 10 may include two SOI wafers (See, FIG. 2A), wherein one of the wafers, designated as 1, includes the first semiconductor layer 16 and the other wafer, designated as 2, includes the second semiconductor 12; an SOI wafer (designated as 2) and a bulk semiconductor wafer (designated as 1; see, FIG. 2B); or an SOI wafer (designated as 2) and a bulk wafer (designated as 1) which includes an ion implant region 11, such as a $H_2$ implant region, which can be used to split a portion of at least one of the wafers during bonding (See FIG. 2C).

Bonding is achieved by first bringing the two wafers into intimate contact with other, optionally applying an external force to the contacted wafers, and then heating the two contacted wafers under conditions that are capable of bonding the two wafers together. The heating step may be performed in the presence or absence of an external force. The heating step is typically performed in an inert ambient at a temperature from about 200° to about 1050° C. for a time period from about 2 to about 20 hours. More typically, the bonding is performed at a temperature from about 200° C. to about 400° C. for a time period from about 2 to about 20 hours. The term "inert ambient" is used in the present invention to denote an atmosphere in which an inert gas, such as He, Ar, $N_2$, Xe, Kr or a mixture thereof, is employed. A preferred ambient used during the bonding process is $N_2$.

In the embodiment where two SOI wafers are employed, some material layers of at least one of the SOI wafers may be removed after bonding utilizing a planarization process such as chemical mechanical polishing (CMP) or grinding and etching. The planarization process stops when surface dielectric layer 18 is reached.

In the embodiment in which one of the wafers includes an ion implant region, the ion implant region forms a porous region during bonding which causes a portion of the wafer above the ion implant region to break off leaving a bonded wafer such as is shown, for example, in FIG. 1A. The implant region is typically comprised of $H_2$ ions which are implanted into the surface of the wafer utilizing ion implantation conditions that are well known to those skilled in the art.

In the embodiment where the wafers to be bonded do not include a dielectric layer therein, the surface dielectric layer 18 may be formed atop the bonded wafers by a thermal process, such as oxidation, or by a conventional deposition process, such as chemical vapor deposition (CVD), plasma-enhanced CVD, atomic layer deposition, chemical solution deposition as well as other like deposition processes.

Figure 1B:
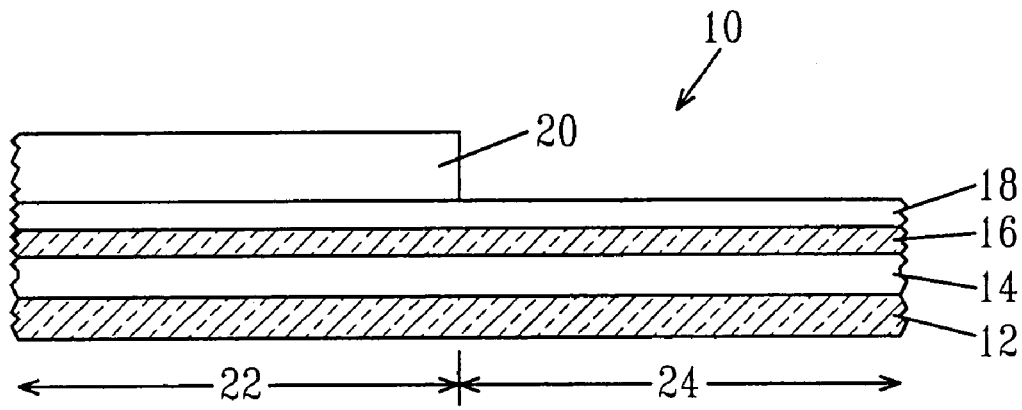

Referring now to FIG. 1B, a mask 20 is then formed on a predetermined portion of the substrate 10 of FIG. 1A so as to protect a portion of the substrate 10, while leaving another portion of the substrate 10 unprotected. The protected portion of the substrate 10 defines a SOI region 22, whereas the unprotected portion of the substrate 10 defines a bulk-Si region 24. In one embodiment, the mask 20 is formed on a predetermined portion of the surface dielectric layer 18 by applying a photoresist mask to the entire surface of the substrate 10. After application of the photoresist mask, the mask is patterned by lithography, which includes the steps of exposing the photoresist to a pattern of radiation and developing the pattern utilizing a resist developer. The resultant structure including the mask 20 formed on a predetermined portion of the substrate 10 is shown, for example, in FIG. 1B.

In another embodiment, the mask 20 is a nitride or oxynitride layer that is formed and patterned utilizing lithography and etching. The nitride or oxynitride mask 20 may be removed after defining the bulk-Si region 24 of the substrate 10.

Figure 1C:
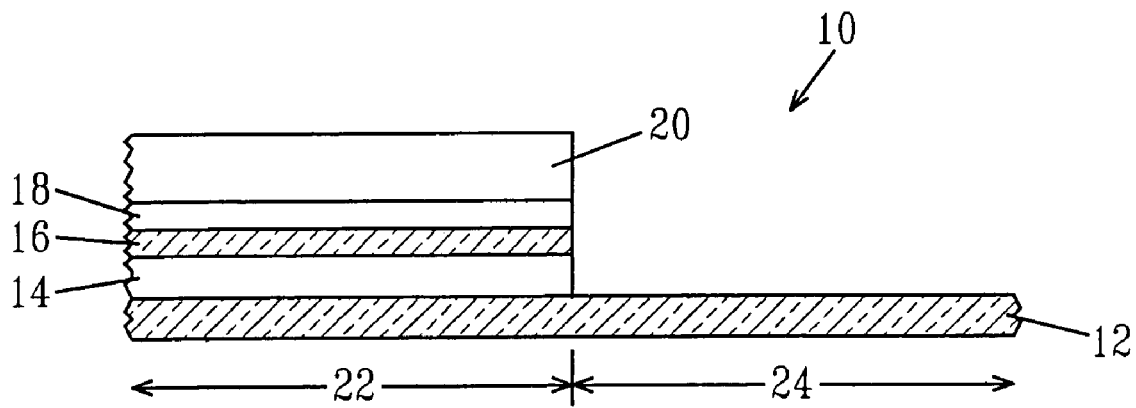

After forming the mask 20 atop the substrate 10, the structure is subjected to one or more etching steps so as to expose a surface of the second semiconductor layer 12 in the bulk-Si region 24. Specifically, the one or more etching steps used at this point of the present invention removes the unprotected portions of the surface dielectric layer 18, as well as underlying portions of the first semiconductor layer 16, and a portion of the insulating layer 14 which separates the first semiconductor layer 16 from the second semiconductor layer 12. The etching may be performed utilizing a single etching process or multiple etching steps may be employed. The etching used at this point of the present invention may include a dry etching process such as reactive-ion etching, ion beam etching, plasma etching or laser etching, a wet etching process wherein a chemical etchant is employed or any combination thereof. In a preferred embodiment of the present invention, reactive-ion etching (RIE) is used in selectively removing the unprotected portions of the surface dielectric layer 18, the first semiconductor layer 16 and the insulating layer 14 in the bulk-Si region 24. The resultant structure after the etching process has been performed is shown, for example, in FIG. 1C. Note that the sidewalls of the protected SOI region 22, i.e., the surface dielectric layer 18, the first semiconductor layer 16 and the insulating layer 14, are exposed after this etching step. As shown, the exposed sidewalls of layers 18, 16 and 14 are aligned with an outer most edge of mask 20.

The mask 20 is then removed from the structure shown in FIG. 1 C utilizing a conventional resist stripping process and then a liner or spacer 25 is typically, but not always, formed on the exposed sidewalls. The liner or spacer 25, which is optional, is formed by deposition and etching. The liner or spacer 25 is comprised of an insulating material such as, for example, an oxide.

After forming the optional liner or spacer 25, a semiconductor material 26 is formed on the exposed second semiconductor layer 12 in the bulk-Si region 24. In accordance with the present invention, semiconductor material 26 has a crystallographic orientation that is the same as the crystallographic orientation of the second semiconductor layer 12. The resultant structure is shown, for example, in FIG. 1D.

The semiconductor material 26 may comprise any Si-containing semiconductor, such as Si, strained Si, SiGe, SiC, SiGeC or combinations thereof, which is capable of being formed utilizing a selective epitaxial growth method. In some preferred embodiments, semiconductor material 26 is comprised of Si. In the present invention, semiconductor material 26 may be referred to as a regrown semiconductor material 26.

Figure 1D:
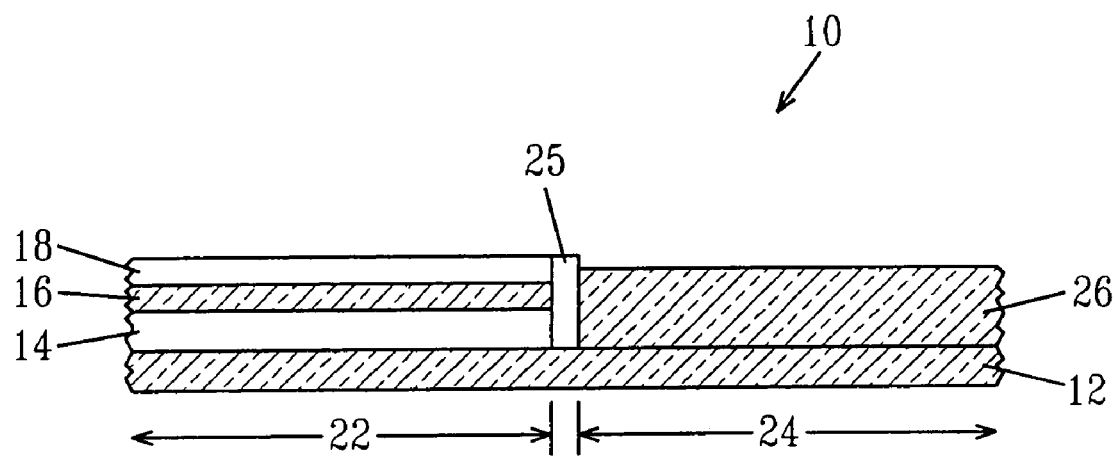

Next, the structure shown in FIG. 1D is subjected to a planarization process such as chemical mechanical polishing (CMP) or grinding such that the upper surface of the semiconductor material 26 is substantially planar with the upper surface of the first semiconductor layer 16. Note that previously protected portion of surface dielectric layer 18 is removed during this planarization process.

After providing the substantially planar surfaces, an isolation region 27, such as a shallow trench isolation region, is typically formed so as to isolate the SOI region 22 from the bulk-Si region 24. The isolation region 27 is formed utilizing processing steps that are well known to those skilled in the art including, for example, trench definition and etching, optionally lining the trench with a diffusion barrier, and filling the trench with a trench dielectric such as an oxide. After the trench fill, the structure may be planarized and an optional densification process step may be performed to densify the trench dielectric.

Figure 1E:
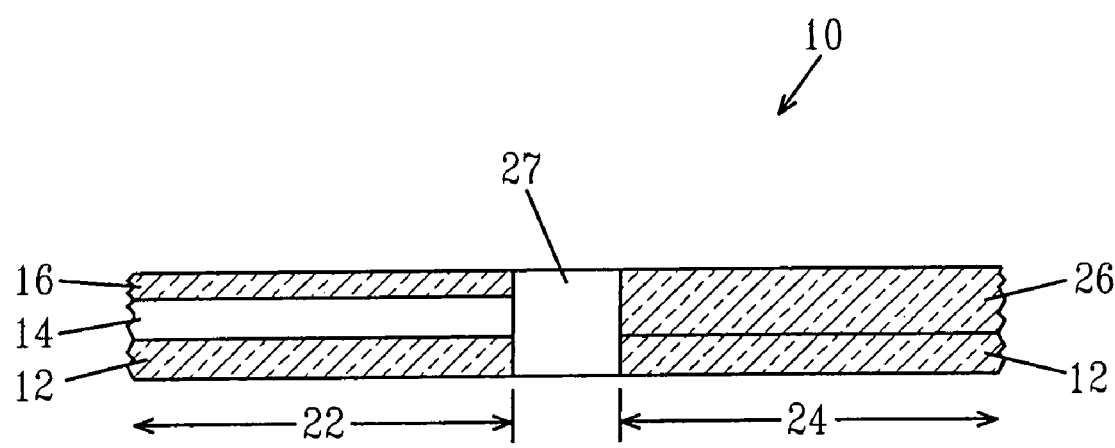

The resultant substantially planar structure containing isolation region 27 is show, for example, in FIG. 1E. As shown, the structure of FIG. 1E includes an exposed first semiconductor layer 16 within the SOI region 22 and the regrown semiconductor material 26 within the bulk-Si region 24, wherein the first semiconductor layer 16 and the semiconductor material 26 have the same or different crystal orientation. In one embodiment of the present invention layers 16 and 24 have the same crystal orientation. In that embodiment of the present invention, layers 16 and 24 preferably having a surface in the (100) crystal plane.

Figure 1F:
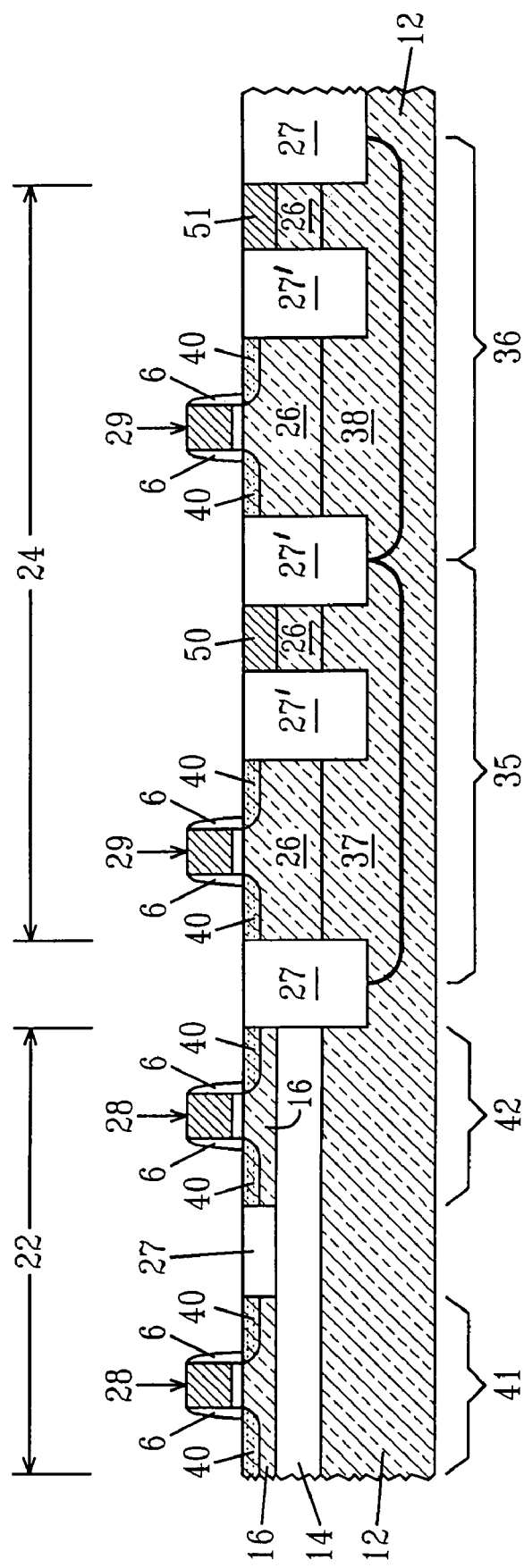

Referring to FIG. 1F and in a next process step, the SOI region 22 is processed to provide SOI MOSFETs and the bulk-Si device region 24 is processed to provide devices having body contacts that substantially eliminate floating body effects and provide a means to adjust the threshold voltages of the FETs in the bulk-Si region.

Prior to processing the SOI region 22 and bulk-Si region 24, device isolation regions 27' may be formed within the substrate 10. Device isolation regions 27' can be provided by selectively etching trenches in the substrate utilizing a conventional dry etching process, such as reactive-ion etching (RIE) or plasma etching, in conjunction with conventional block masks. The device isolation regions 27' provide isolation within the bulk-Si region 24 and the SOI region 22 and are similar to the isolation region 27 that separates the bulk-Si region 24 from the SOI region 22. Alternatively, the device isolation regions 27' may be field isolation regions that are formed using a local oxidation of silicon process.

The SOI region 22 and the bulk-Si region 24 may be individually processed utilizing conventional block mask techniques. A block mask may comprise conventional soft and/or hardmask materials and can be formed using deposition, photolithography and etching. In a preferred embodiment, the block mask comprises a photoresist. A photoresist block mask can be produced by applying a blanket photoresist layer to the substrate 10 surface, exposing the photoresist layer to a pattern of radiation, and then developing the pattern into the photoresist layer utilizing a conventional resist developer.

Alternatively, the block mask can be a hardmask material. Hardmask materials include dielectrics that may be deposited by chemical vapor deposition (CVD) and related methods. Typically, the hardmask composition includes silicon oxides, silicon carbides, silicon nitrides, silicon carbonitrides, and other like materials. Spin-on dielectrics may also be utilized as a hardmask material including, but not limited to: silsesquioxanes, siloxanes, and boron phosphate silicate glass (BPSG).

Well regions 37, 38 may be formed in the bulk-Si region 24 by selectively implanting p-type or n-type dopants into the bulk-Si region 24 of the substrate 10, wherein the SOI region 22 of the substrate 10 may be protected by a block mask as described above. In the example depicted in FIG. IF, a pFET bulk-Si device region 35 is implanted to provide an n-type well 37 and an nFET bulk-Si device region 36 is implanted to provide a p-type well 38.

The SOI layer may also be selectively implanted in the SOI region 22. In the example depicted by FIG. 1F, a pFET SOI region 41 is implanted to provide a n-type channel region and an nFET SOI region 42 is implanted to provide a p-type channel region.

The gate conductor stacks 28, 29 can then be formed within the SOI region 22 and bulk-Si region 24 by first blanket depositing a gate dielectric layer atop the substrate surface and then depositing a gate conductor layer atop the gate dielectric layer. The gate dielectric layer may comprise any conventional gate dielectric material, such as $SiO_2$, or any high-k gate dielectric material, such as $HfO_2$. The gate conductor layer may comprise any conductive material, such as doped polysilicon. The gate conductor and gate dielectric layer are then etched using conventional deposition, photolithography, and etch processes to provide gate conductor stacks 28, 29 within the SOI region 22 and bulk-Si region 24 of the substrate 10, as depicted in FIG. 1F. Alternatively, block masks may be used to provide the gate conductor stacks 28 within the SOI region 22 and the gate conductor stacks 29 within the bulk-Si region 24 separately.

In the embodiment depicted in FIG. 1F and during a next series of process steps, SOI MOSFET devices are then selectively formed within the SOI region 22, while the bulk-Si region 24 is protected by a hard or soft block masks. For example, a block mask provided by a patterned photoresist can be formed prior to implantation to preselect the substrate area within the SOI region 22 for gate conductor and/or source/drain diffusion region 40 doping with one dopant type. The block mask application and implantation procedure can be repeated to dope selected conductive material of gate conductor stacks 28, source/drain diffusion regions 40, source/drain extension regions or halo regions (not shown) with different dopant types, such as n-type or p-type dopant. After each implant, the block mask resist may be removed using conventional photoresist strip chemistries. In one preferred embodiment, the pattern and implant process steps may be repeated to provide at least one pFET device 41 and at least one nFET 42 device, in which the pFET and nFET devices 41, 42 are separated by isolation regions 26'.

Prior to implantation, spacers 6 are formed abutting the gate stacks 28, wherein the width of the spacer may be adjusted to compensate for different diffusion rate of the p-type and n-type dopants. In addition, the pFET and nFET devices within the SOI region 22 may be processed to provide silicide regions or any other conventional structures typically utilized in ultra thin channel MOSFETS. Following the formation of the devices 41, 42 within the SOI region 22, the hardmask may be stripped from the bulk-Si region 24 and another hardmask is then formed atop the SOI region 22 of the substrate 10 leaving the bulk-Si region 24 exposed.

The bulk-Si region 24 can then be processed to provide devices having increased performance on a bulk-Si substrate, as opposed to a SOI substrate. For example, the bulk-Si region 24 may be processed to provide devices typically common in semiconductor manufacturing, such as resistors; capacitors, including decoupling capacitors, planar capacitors, and deep trench capacitors; diodes; and memory devices, such as dynamic random access memory (DRAM) and embedded dynamic random access memory (eDRAM). In a preferred embodiment, the bulk-Si region 24 comprises body contacts 50, 51. In one example, as depicted in FIG. 1F, the bulk-Si region 24 is processed to provide MOSFETS having body contacts 50, 51.

In the embodiment depicted in FIG. 1F, the bulk-Si region 24 is processed to provide at least one p-type MOSFET 35 and at least one n-type MOSFET 36 each having body contacts 50, 51, in which the p-type MOSFETs 35 are separated from the n-type MOSFETs 36 by device isolation regions 27'. Similar to the devices formed within the SOI region 22, the bulk-Si region 24 may be selectively implanted to provide p-type MOSFETs 35 and n-type MOSFETs 36 utilizing patterned block masks.

Following implantation, body contacts 50, 51 are then formed to at least one device within the bulk-Si region 24 of the substrate 10. The body contact 50, 51 to each MOSFET device 35, 36 within the bulk-Si region 24 is in electrical contact to the well region of the device and is separated from the MOSFET's source and drain regions 40 by an isolation region 26.

The body contacts 50, 51 may be formed using photolithography, etching, and deposition. More specifically, a body contact 50, 51 may be formed by patterning a portion of the substrate 10 within the bulk-Si region 24 and etching the exposed surface to form via holes to at least one well region 37,36 of at least one MOSFET 35, 36. The etch process can be a directional etch, such as reactive-ion etch. Following via formation, body contacts 50, 51 are then formed by depositing a conductive material into the via holes using conventional processing, such as CVD or plating. The conductive material may be doped polysilicon or a conductive metal. The conductive metal may include, but is not limited to: tungsten, copper, aluminum, silver, gold, and alloys thereof. In a preferred embodiment, the body contact 51 to the nFET SOI device 36 is p-type doped polysilicon and the body contact 50 to the pFET SOI device 35 is n-type doped polysilicon.

Note that the devices formed within the SOI region 22 and the devices formed within the bulk-Si region 24 of the substrate 10 are both formed atop surfaces having the same or different crystal orientation. In one preferred embodiment, the devices within the SOI region 22 and the devices formed within the bulk-Si region 24 are both formed on a surface having a (100) crystal plane. In another preferred embodiment, the nFET and pFET devices within the SOI region 22 are formed on a surface having a (100) crystal plane and the pFET devices formed within the bulk-Si region 24 are both formed on a surface having a (110) crystal plane. In another preferred embodiment, the pFET devices within the SOI region 22 are formed on a surface having a (110) crystal plane and the nFET and pFET devices formed within the bulk-Si region 24 are both formed on a surface having a (100) crystal plane.

A type A hybrid CMOS to include nFET devices in the bulk-Si region 24 and pFET devices in the SOI region 22 and conversely a type B hybrid CMOS to include pFET devices in the bulk-Si region 24 and nFET devices in the SOI region 22 with all devices in a (100) crystallographic orientation are considered. Also considered is a type A HOT CMOS to include (100) crystallographic oriented nFET devices in the bulk-Si region 24 and either (110) or (111) crystallographic oriented pFET devices in the SOI region 22 and conversely a type B HOT CMOS to include either (110) or (111) crystallographic oriented pFET devices in the bulk-Si region 24 and (100) crystallographic oriented nFET devices in the SOI region 22.

Figure 3:
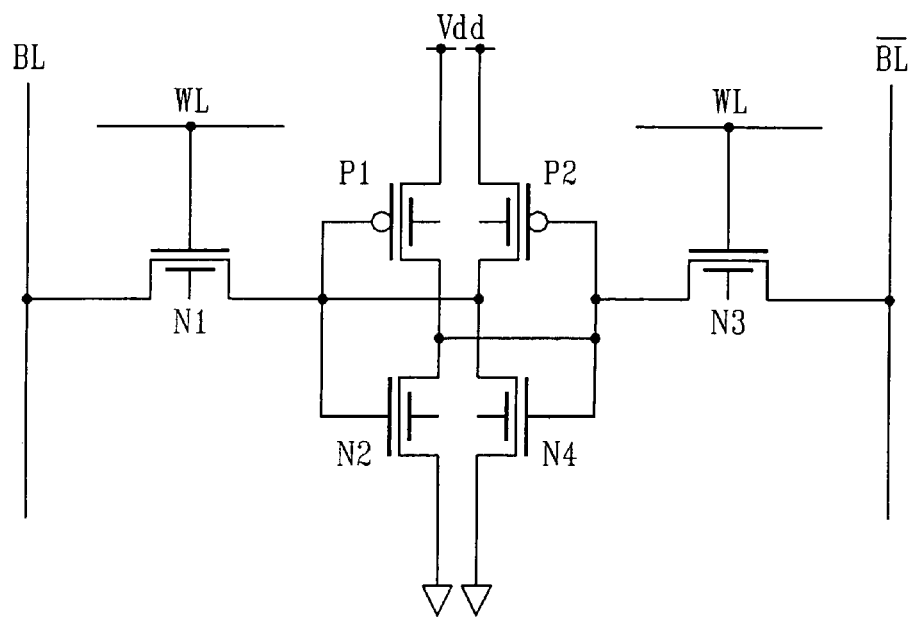
FIG. 3 is a schematic representations of a conventional 6T SRAM cell in an SOI substrate (the prior art). Body nodes for all transistors are floating. All transistors are normally in (100) crystallographic orientation silicon.

FIG. 3 shows the schematic of a conventional SOI 6T-SRAM cell with all body (or well) nodes uncontacted and therefore floating. The four most likely 6T-SRAM cell cases of the present invention that would be implemented in the physical structure outlined in FIG. 1F are shown in FIGS. 4A-D. Note that the cell layouts that are schematically shown in FIGS. 4A-4D are made using the processing steps described above. In the above, the FETs within the SOI region 22 and the bulk-Si region 24 include a total of six transistors whose configuration will be described in greater detail below.

Figure 4A:
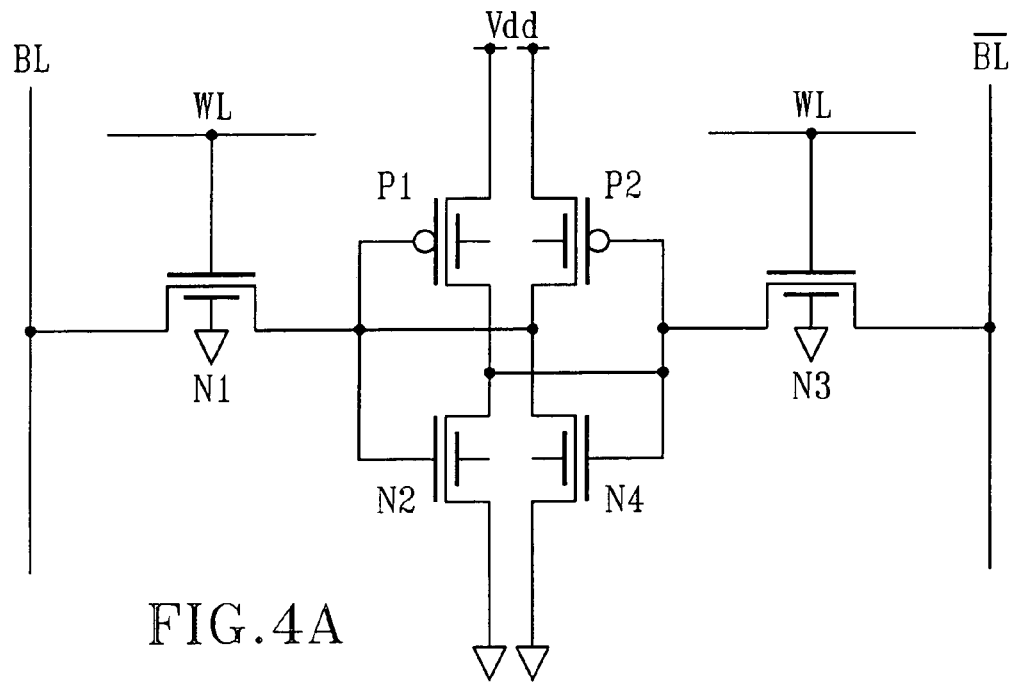
FIGS. 4A-4D are schematic representations of the inventive hybrid bulk-SOI 6T cell, with well contact to ground of the supply voltage (Vdd) in the schematic indicating the FET devices in the bulk region and the omission of a such a well contact indicating a floating body device in the SOI region.

FIG. 4A shows a schematic of 6T-SRAM cell in type A hybrid CMOS. nFETs N1 and N3 are placed in bulk CMOS region 24. All transistors are placed in 100 silicon. This configuration has stability benefits since there are no longer floating body effects in the pass-gate. In addition, placing the pass-gates (nFETs N2 and N3 in bulk increase the pFET pull-down to nFET pass-gate current drive ratio (beta) since the body effect increases the pass-gate Vt. Maintaining the nFET pull-down in the SOI region maintains the speed advantages of SOI for these devices.

Figure 4B:
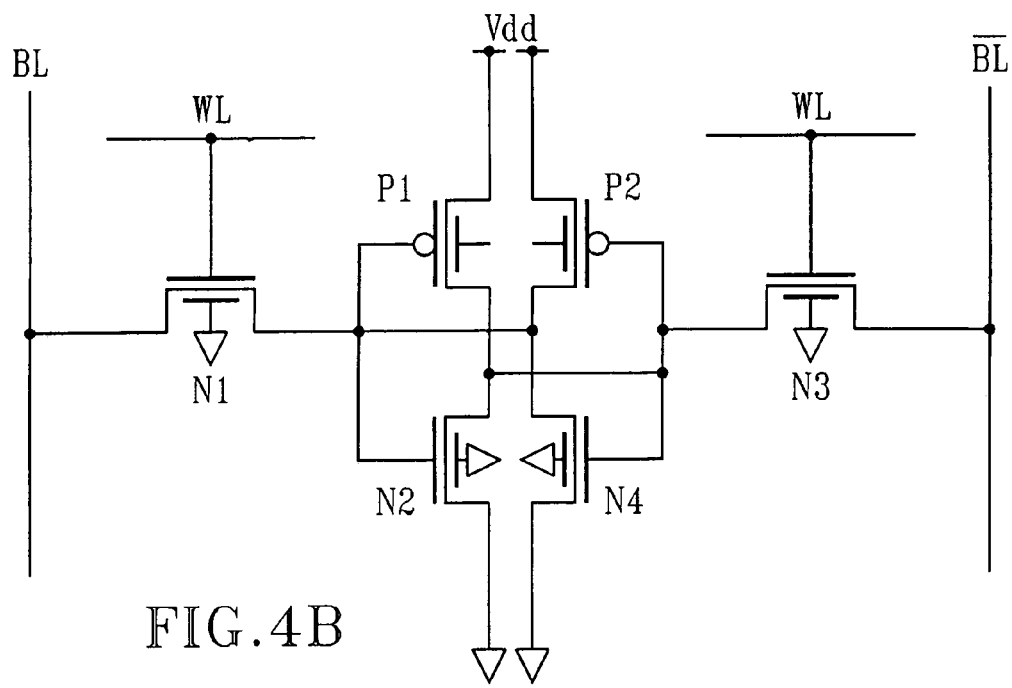

FIG. 4B shows a schematic of 6T-SRAM cell in type A hybrid CMOS or type A HOT CMOS. nFETs N1, N2, N3 and N4 are placed in bulk CMOS. The nFETs are all in (100) crystallographic oriented silicon, the pFETs can be either (110) or (100) crystallographic oriented silicon. This embodiment has the best cell stability since there is no floating body effect in both the pass-gate and pull-down nFET devices. A faster pFET (either from SOI or due to the (110) crystallographic oriented silicon mobility improvement) also improves stability, and has little impact on cell read performance.

Figure 4C:
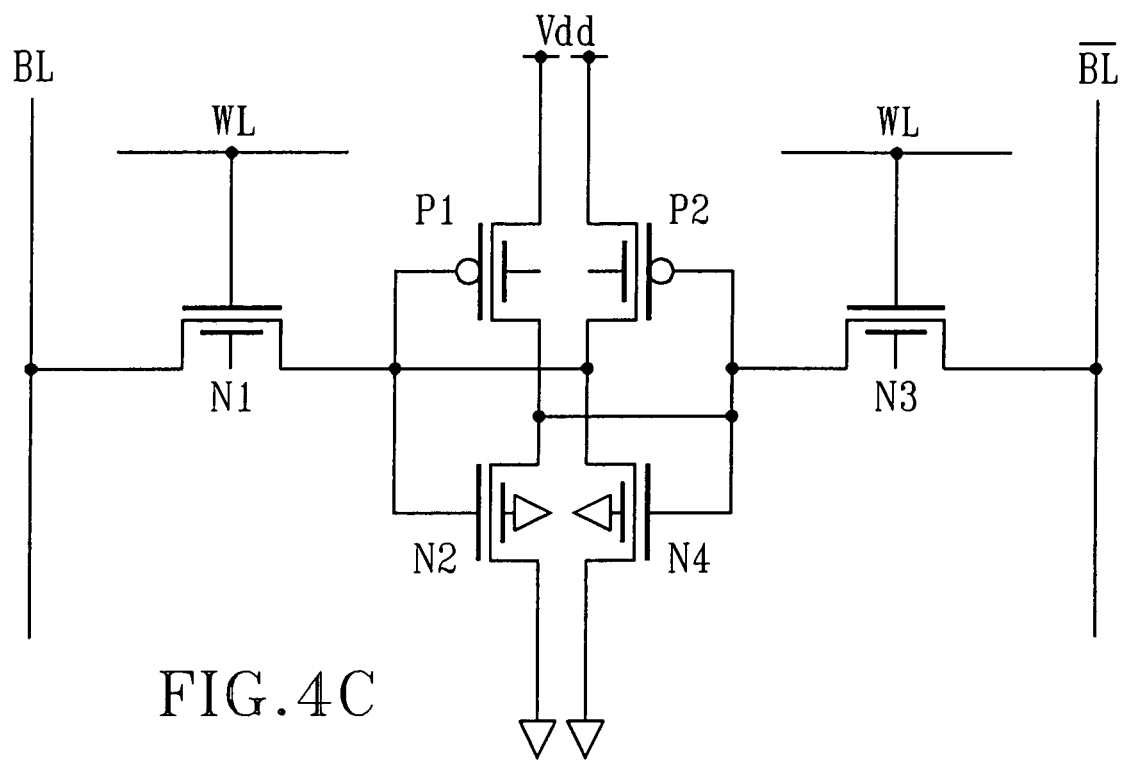

FIG. 4C shows a schematic of 6T-SRAM cell in type A hybrid CMOS. Pull-down nFETs N2 and N4 are placed in bulk CMOS. All transistors are in (100) crystallographic oriented silicon. With the pull-down nFETs in bulk, the main contributor to Vt problems in SOI is eliminated, but the pass-gate still helps to maintain the SOI speed advantage as a reduced junction capacitance on the pass-gate reduces the bit line capacitance.

Figure 4D:
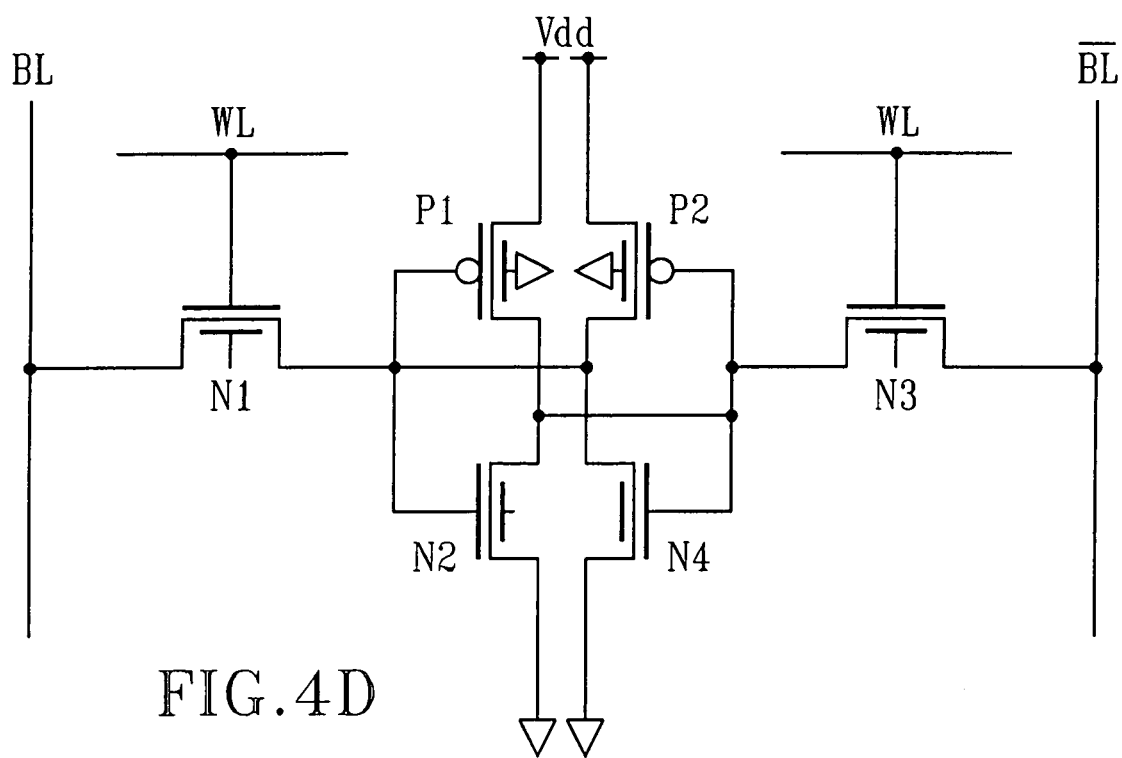

FIG. 4D shows a schematic of 6T-SRAM cell in type A hybrid CMOS or type A HOT CMOS. pFETs P1 and P2 are placed in bulk CMOS and can either be 100 or 110 silicon. While most likely a less significant impact to cell stability than the previously listed embodiments, placing the pFETs pull-up devices in bulk will improve stability.

In all the embodiments presented in FIGS. 4A-D, the well node can be attached to a bias supply that can dynamically adjust the well bias value. This permits the use of adaptive well biasing schemes. Through apply a well bias, the Vt's of the devices in the bulk region are tunable. This Vt control is a very useful technique to selectively adjust the circuit for either higher performance (low Vt) or optimized power consumption (high Vt).

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims

What is claimed is:

1. A 6T-SRAM cell semiconducting structure comprising:
a substrate comprising an SOI region and a bulk-Si region, wherein said SOI region and said bulk-Si region have a same or differing crystallographic orientation;
an isolation region separating said SOI region from said bulk-Si region;
a well region underlying a device in said bulk-Si region and a contact to said well region, wherein said contact stabilizes floating body effects and provides a means for adjusting the threshold voltages in FETs in the bulk-Si region through the application of a bias voltage; and
a device configuration selected from the group consisting of (a) two pass-gate nFET devices located in the bulk-Si region and two pull-down nFET devices and two pull-up pFET devices located in the SOI region, (b) two pass-gate nFET devices and two-pull pull down nFET devices located in the bulk-Si region and two pull-up pFET devices located in the SOI region, (c) two pull-down nFET devices located in the bulk-Si region and two pass-gate nFET devies and two pull-up pFET devices located in the SOI region and (d) two pull-up pFET devices located in the bulk-Si region and a pull-down nFET and a pass gate nFET located in the SOI region.

2. The 6T-SRAM cell semiconducting structure of claim 1 wherein device configuration (a) is present.

3. The 6T-SRAM cell semiconducting structure of claim 2 wherein said bulk-Si region and said SOI region have the same crystal orientation.

4. The 6T-SRAM cell semiconducting structure of claim 3 wherein said same crystal orientation is (100).

5. The 6T-SRAM cell semiconducting structure of claim 2 wherein said bulk-Si region and said SOI region have different crystal orientations.

6. The 6T-SRAM cell semiconducting structure of claim 5 wherein said different crystal orientations comprise (100), (110) or (111).

7. The 6T-SRAM cell semiconducting structure of claim 2 wherein said bulk-Si region and said SOI region comprise the same or different semiconductor material.

8. The 6T-SRAM cell semiconducting structure of claim 7 wherein said semiconductor material is a Si-containing semiconductor material.

9. The 6T-SRAM cell semiconducting structure of claim 1 wherein device configuration (b) is present.

10. The 6T-SRAM cell semiconducting structure of claim 9 wherein Said bulk-Si region and said SOI region have the same crystal orientation.

11. The 6T-SRAM cell semiconducting structure of claim 10 wherein said same crystal orientations is (100).

12. The 6T-SRAM cell semiconducting structure of claim 9 wherein said bulk-Si region and said SOI region have different crystal orientations.

13. The 6T-SRAM cell semiconducting structure of claim 12 wherein said different crystal orientation comprise (100), (110) or (111).

14. The 6T-SRAM cell semiconducting structure of claim 9 wherein said bulk-Si region and said SOI region comprise the same or different semiconductor material.

15. The 6T-SRAM cell semiconducting structure of claim 14 wherein said semiconductor material is a Si-containing semiconductor material.

16. The 6T-SRAM cell semiconducting structure of claim 1 wherein device configuration (c) is present.

17. The 6T-SRAM cell semiconducting structure of claim 16 wherein said bulk-Si region and said SOI region have the same crystal orientation.

18. The 6T-SRAM cell semiconducting structure of claim 17 wherein said same crystal orientation is (100).

19. The 6T-SRAM cell semiconducting structure of claim 16 wherein said bulk-Si region and said SOI region have different crystal orientations.

20. The 6T-SRAM cell semiconducting structure of claim 19 wherein said different crystal orientations comprise (100), (110) or (111).

21. The 6T-SRAM cell semiconducting structure of claim 16 wherein said bulk-Si region and said SOI region comprise the same or different semiconductor material.

22. The 6T-SRAM cell semiconducting structure of claim 21 wherein said semiconductor material is a Si-containing semiconductor material.

23. The 6T-SRAM cell semiconducting structure of claim 1 wherein device configuration (d) is present.

24. The 6T-SRAM cell semiconducting structure of claim 23 wherein said bulk-Si region and said SOI region have the same crystal orientation.

25. The 6T-SRAM cell semiconducting structure of claim 24 wherein said same crystal orientation is (100).

26. The 6T-SRAM cell semiconducting structure of claim 23 wherein said bulk-Si region and said SOI region have different crystal orientations.

27. The 6T-SRAM cell semiconducting structure of claim 26 wherein said different crystal orientations comprise (100), (110) or (111).

28. The 6T-SRAM cell semiconducting structure of claim 23 wherein said bulk-Si region and said SOI region comprise the same or different semiconductor material.

29. The 6T-SRAM cell semiconducting structure of claim 28 wherein said semiconductor material is a Si-containing semiconductor material.

30. A semiconductor structure comprising:

a 6T-SRAM cell located on a hybrid substrate, said hybrid substrate comprising an SOI region and a bulk-Si region, wherein said SOI region and said bulk-Si region have a same or different crystallographic orientation, and said 6T-SRAM cell comprises a device configuration selected from the group consisting of (a) two pass-gate nFET devices located in the bulk-Si region and two pull-down nFET devices and two pull-up pFET devices located in the SOI region, (b) two pass-gate nFET devices and two-pull down nFET devices located in the bulk-Si region and two pull-up pFET devices located in the SOI region, (c) two pull-down nFET devices located in the bulk-Si region and two pass-gate nFET devices and two pull-up pFET devices located in the SOI region and (d) two pull-up pFET devices located in the bulk-Si region and a pull-down nFET and a pass-gate nFET located in the SOI region; and a well region underlying a device in said bulk-Si region and a contact to said well region, wherein said contact stabilizes floating body effects and provides a means for adjusting threshold voltages in FETs in the bulk-Si region through application of a bias voltage.

* * * * *